United States Patent [19]
Fierro

[11] Patent Number: 4,886,462
[45] Date of Patent: Dec. 12, 1989

[54] CIRCUIT BREAKER PRINTED CIRCUIT BOARD CONNECTOR DEVICE

[75] Inventor: Joseph Fierro, Trenton, N.J.

[73] Assignee: Heinemann Electric Company, Lawrenceville, N.J.

[21] Appl. No.: 150,889

[22] Filed: Feb. 1, 1988

[51] Int. Cl.$^4$ ............................................. H01R 9/09
[52] U.S. Cl. .................................. 439/79; 361/417; 439/622
[58] Field of Search ..................... 439/76, 78–82, 439/621, 622; 361/115, 376, 400, 417; 200/50 B, 51 R, 294

[56] References Cited

U.S. PATENT DOCUMENTS

| | | | |
|---|---|---|---|
| 3,335,387 | 8/1967 | Mueller | 439/79 |
| 4,307,925 | 12/1981 | Drew | 439/622 |
| 4,609,242 | 9/1986 | Kemppainen | 439/78 |
| 4,771,367 | 9/1988 | Serr et al. | 361/417 |

*Primary Examiner*—P. Austin Bradley
*Attorney, Agent, or Firm*—Dann, Dorfman, Herrell and Skillman

[57] ABSTRACT

A connector receptacle is provided with one flat external side for application to a printed circuit board. The connector receptacle has enclosing guiding walls terminating in a latch element. At least a pair of conductive female connectors are provided within slots in the connector receptacle. Each of these pieces providing the connectors consists of a pair of aligned female conductors integral with a pin connector support interconnected through a bridge and is formed of a single piece of sheet metal. The bridge also extends between the aligned pair of female conductors and supports a transversely extending spring tab which is used to enter a transverse slot in the connector receptacle to hold the integral piece in place. The female connector pieces are reversible for use in the slots provided on opposite sides of the connector receptacle. The circuit breaker, having electric terminal connectors which cooperate with the female connectors of the receptacle, is modified to provide a latch element extending in the direction of the terminal connectors from the circuit breaker and cooperative with the latch element on the connector receptacle to engage and hold the circuit breaker in position with the terminal connectors engaged with the female connectors of the connector receptacle.

10 Claims, 3 Drawing Sheets

CIRCUIT BREAKER PRINTED CIRCUIT BOARD CONNECTOR DEVICE

The present invention relates to a circuit breaker printed circuit board connector device. More specifically the present invention relates to a means for connecting a circuit breaker to a printed circuit board in a readily releasable way. The invention also relates to a female double ended metal electrical terminal connector for the connector device. These terminals are used interchangably in two positions, left or right, to cooperate with two male terminal prongs of an electrical circuit breaker. The term "circuit breaker" as used herein includes devices known as "circuit protectors".

STATE OF THE ART

Printed circuit boards have become used increasingly with various types of devices. Circuit breakers have seemed essentially incompatible and in most cases too awkwardly large to use with printed circuit boards. The present invention, however, provides an arrangement whereby a circuit breaker can be connected compactly and efficiently to a printed circuit board in such a way that the circuit breaker can be released and replaced without breaking soldered joints. Such a device has not been available in the prior art.

NATURE OF THE PRESENT INVENTION

By use of the intermediate connector device, secure permanent connection of the connector device to the printed circuit board may be obtained. The connector device, in turn, permits easy connection and release of the circuit breaker so that the breaker can be removed when not needed or can be replaced, if damaged, without destroying the entire printed circuit board.

More specifically, the present invention relates to a circuit breaker printed circuit board connector device having a receptacle provided with enclosing walls having at least one flat side for application to printed circuit boards. At least a pair of conductive electrical connectors are supported within the walls by the receptacle. Terminal members are electrically connected to the connectors and mechanically supported by the receptacle. The terminals are arranged generally parallel to one another so as to be insertable in receiving openings on the printed circuit board and so that at least one flat side may be brought against the printed circuit board and pin connectors of the terminal soldered to different conductors of the printed circuit board in that position. A cooperative latch element including a transverse shoulder is provided on the receptacle for cooperating with a latch element supported by the circuit breaker such that when the circuit breaker is moved into the receptacle to connect the breaker connectors to the connectors on the receptacle, either the latch element, the cooperative latch element, or both, is deflected transversely of the direction of movement and then resiliently repositioned so that the respective latch elements will interengage and hold the circuit breaker in position connected to the printed circuit board.

As a practical matter, the conductive electrical connectors within the connector receptacle are made of stamped and formed sheet metal conductive material which is designed to be integral with pin connectors for solder connection to the circuit board. The conductive electrical connectors are preferably female connectors in the form of channel receptacles with the edges of the channel sidewalls folded over generally parallel to the channel bottom to snugly receive and conductively clamp against conventional prong terminals on the circuit breaker.

The connector receptacle is preferably molded in resinous material to provide connector retaining slots which permit the insertion of the conductive electrical connectors in the direction of their longitudinal channel extension. Preferably a resilient latch tab is provided on each connector adapted to be guided in the retaining slots or grooves in a stressed insertion position and relieved by movement of the tab into a molded positioning channel oriented in a direction transverse to the motion of the electrical connector as it is inserted. Once the latch tab is received into this positioning channel, the sidewalls of the positioning channel will hold the latch tab and hence the connector in position, since the conductive electrical connector is otherwise confined within the slots into which it has been inserted.

The electrical connectors on the circuit breaker are generally normal to a circuit breaker wall and aligned with the female connector on the connector receptacle. The breaker connector cannot be inserted into the female connectors past the latch tab. The latch tab is intermediate the aligned essentially identical female connector terminal pieces, one of which is not used, but because the structure is symmetrical, when it is reversed, and used in a reverse slot on the other side of the connector receptacle, the other female connector terminal piece will receive the other breaker connector.

More specifically, the female electrical connector of the present invention consists of a conductive sheet metal member having a neck connecting the channel base and a common support bar for pin connectors to be inserted in holes in the printed circuit board. The female connectors are formed on opposite sides of the connecting strip which connects them to the pin connector support bar. The channel connectors are formed by bending the flat sheet at the edges of the channel bottom and again at the top of the side walls and enclosure walls along opposite edges of the channel base. A spring latch is provided by bending the piece out of the plane of the base transverse to the plane of the base.

The formed sheet metal connector piece is inserted into a slot in a molded resinous connector receptacle which slot provides an end profile of the piece being inserted, so that that piece is confined in every direction except the one in which it is inserted. The spring tab must be elastically deformed slightly to fit into a transverse slot and is held in position by that slot until a positioning channel somewhat wider than the spring tab is reached. At this point, the spring tab relaxes and moves into the positioning channel to hold and lock the piece in position.

DRAWINGS OF THE PRESENT INVENTION

SPECIFIC EMBODIMENT OF THE PRESENT INVENTION

Figure 1:
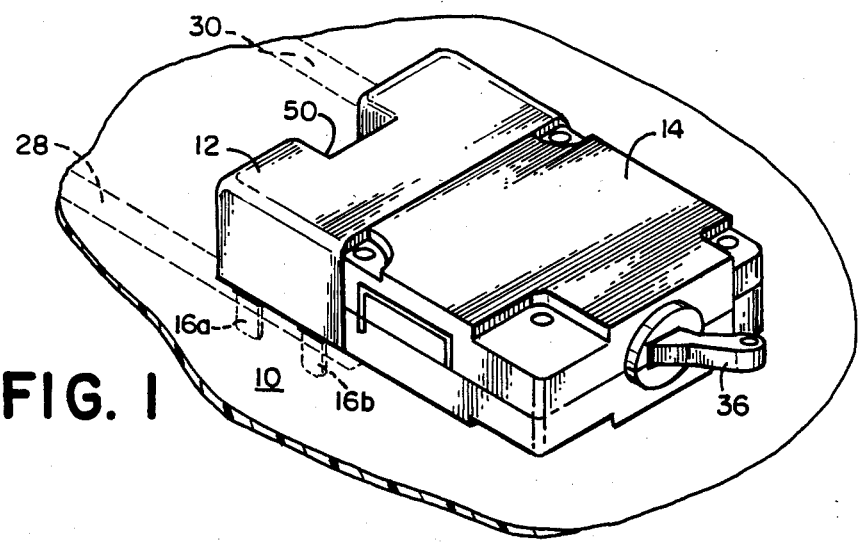
FIG. 1 is a perspective view of the circuit breaker printed circuit board connector device mounted on a circuit board with a circuit breaker in place and operable.
Figure 4:
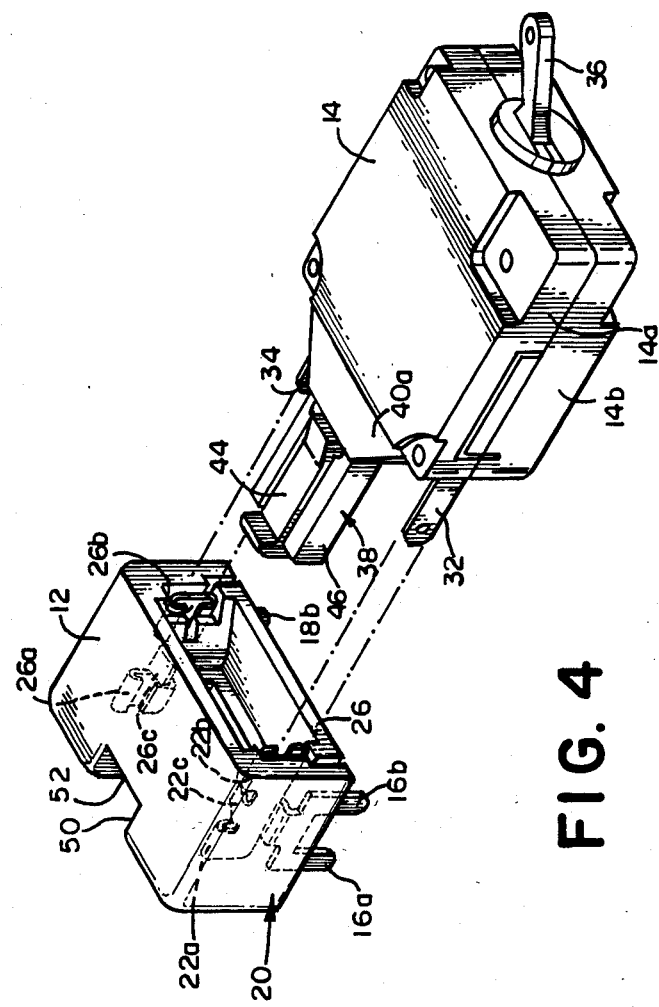
FIG. 4 is an exploded view, showing partially in phantom the connector elements inside of the connector device which is separated from the circuit breaker but with the circuit breaker aligned for cooperation with the connector device.
Figure 5:
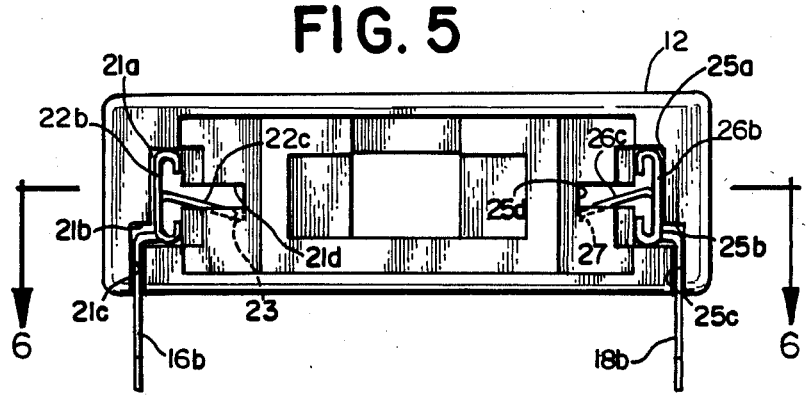
FIG. 5 is an end view of the receptacle showing in profile the slots in which the female connectors are inserted.
Figure 6:
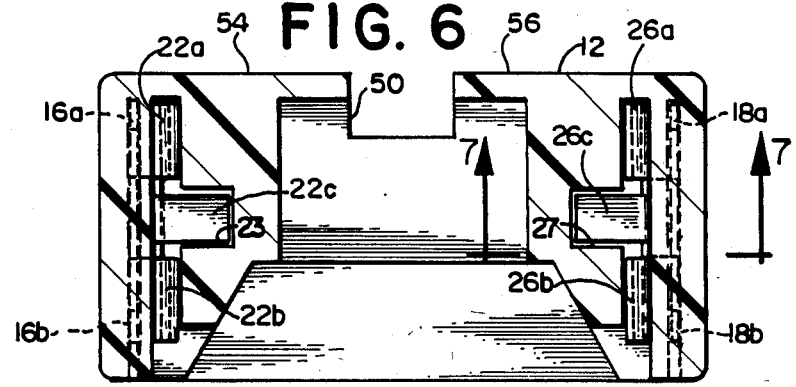
FIG. 6 is a sectional view taken along line 6—6 in FIG. 5.
Figure 7:
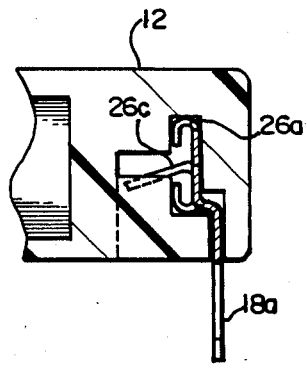
FIG. 7 is a partial sectional view taken along line 7—7 of FIG. 6.

Referring first to FIG. 1 it will be seen that the drawing shows a printed circuit board 10 to which is affixed a connector receptacle 12 and in which a circuit breaker device 14 is inserted and connected. The connector receptacle is connected to the printed circuit board through pin connectors integral with the connectors as seen in FIGS. 4, 5 and 7. The pin connectors 16a and 16b or 18a and 18b are electrically and mechanically connected to the respective electrical connectors 22a and 22b or 26a and 26b. Each of these identical pieces is part of a novel single piece pin and connector structure 20. The connector portion 22 or 26 has two aligned channel shaped resilient clamp members 22a and 22b of a size and shape to yield and resiliently receive a male terminal on the circuit breaker. The connector device also has a locking spring tab 22c or 26c. The connector structures 20 are identical so that only one part design is required, but are oriented in parallel but opposed positions when assembled in the molded resinous connector receptacle 12. As see in FIG. 5 the connector receptacle 12 is provided with insertion slots 21a, 21b and 21c in molded portion 54 and 25a, 25b and 25c in molded portion 56. These slots conform to the profile of the respective connector structure which enables the connector structures to be inserted so that the sidewalls of the slots guide the respective connector structures 20 into position and hold them there. At the time of assembly the locking spring is resiliently deformed to a position which will pass through the slot provided for it generally normal to the connectors and then relax into the positioning channel molded into the resinous material of the connector receptacle. The spring tabs 22c and 26c each require a slight mechanical flexing to the horizontal position to line up with the slots 23 and 27 respectively in the housing for this purpose. As the piece is pushed further the spring tab moves down into the locking channel whose side walls prevent further movement. Locking occurs when slight mechanical flexing of tabs 22c or 26g previously mentioned is relaxed allowing tab 22c or 26c to return to an untensioned condition, causing the locking feature to take place as the locking spring tab sides are then confined within the sides of the positioning channel. In order to remove these connector terminals, a tool such as a screw driver is required to be positioned against the bottom side of the tabs 22c and 26c while at the same time moving the connector structure 20 in the direction opposite from assembly.

The connector structure 20 is conveniently formed of a single piece of conductive sheet metal of good conductivity, such as brass or copper.

Figure 2:
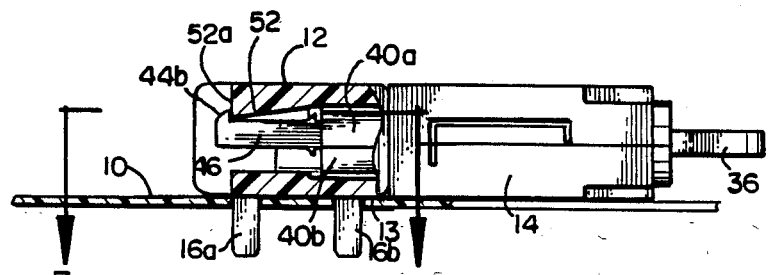
FIG. 2 is a side elevational view of the combination of FIG. 1 with the connector device partially in section.

The connector receptacle is preferably of hollow rectangular form, open at both ends, as shown, but at last at one of its two ends. However, the enclosure may be of other shape and construction provided that it has preferably at least one flat sidewall 13 which rests against the printed circuit board 10 as seen in FIG. 2. This flat side of the assembly is pressed against the printed circuit board as the pin connectors are inserted through slots in the printed circuit board in proper position to be soldered to conductors. The pin connectors 16a, 16b, 18a and 18b preferably project parallel to one another and normal to the flat side of the connector receptacle, but may be brought out the sidewalls of the housing or modified in various ways in other embodiments. When in place, the flat side 13 of the connector device preferably lies flat against the circuit board adding mechanical support and stability. The pin connectors can then be soldered in place to the conductors 28 and 30 on the opposite sides of the printed circuit board as shown in FIG. 2 using conventional soldering techniques well known in the solid state device and integrated circuit art. Once the connector receptacle 12 is affixed to the circuit board 10, circuit breaker 14 may be inserted.

Circuit breaker 14 may be any conventional circuit breaker. For this kind of application, preferably it has a generally flat rectangular molded resin case made in two halves 14a and 14b suitably secured together and enclosing the active elements of the circuit breaker. Conventional breaker terminals 32 and 34 typically extend parallel to one another through one end edge of the casing. A toggle actuator 36 protrudes from the edge opposite that from which the terminals are supported.

The conventional breaker is somewhat modified by adding the latch structure, generally designated 38 in FIG. 4. To support the latch structure the casing is extended by solid trapazoidal extensions 40a and 40b of each casing 14a and 14b. Through these extensions is provided a passage of rectangular cross section, dimensioned to snugly enclose the latch structure within the thickened upper and lower walls of the casing. Between the passage walls and the latch structure 38 are provided interlocking pieces to hold the latch structure from slipping within the passage which may include stud projections fitting into holes 38a. The latch structure may also be provided with a stop extension 38b extending behind the casing walls to further prevent pulling out of the latch structure. Forming the actual latch lever 44 are a pair of slots, one extending from each of the two holes 38a separating the latch lever 44 from bounding and supporting portions 46 of the block from which the latch lever is formed. The remaining connectors may also be thinned between the two holes 38a. Latch lever 44 provides its own resilience at 44c to allow it to move up and down, and the lever 44 is terminated in an upwardly extending beveled or rounded nose 44b designed to be driven downwardly as seen in FIG. 2 by cam surface 52. When the nose 44b passes cam 52, latch 44 moves up and the rearward shoulder of latch nose 44b engages shoulder or latch keeper 52a, as best seen in FIG. 2. The connector receptacle upper wall 12 is also cut away in a keyway 50 terminating in the keeper edge 52a which the latch shoulder nose 44b engages.

Figure 3:
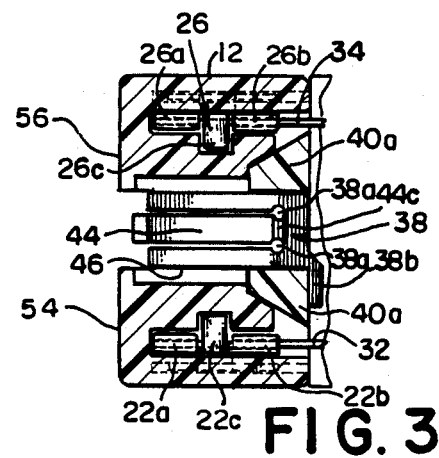
FIG. 3 is a highly schematic sectional view taken along 3—3 of FIG. 2.

As best seen in FIGS. 2 and 3, the connector receptacle 12 is provided with enclosure walls which guide the latch structure into the enclosure at the open end and help position the structure for terminal engagement. Access is kept readily available to the latch 44 in order to permit manual movement of the latch structure downwardly to release the latch and allow removal of the circuit breaker manually.

As seen in FIG. 3, the breaker terminal connectors 32 and 34 are snugly engaged by the female connectors 22b and 26b making good electrical contact. Since the pin connectors are permanently soldered in place this results in good electrical connection between the circuit breaker and the printed circuit on the circuit board. In other cases there may be additional terminals beside the two shown, but the principals of the invention still apply. The breaker terminals 32 and 34 are arranged straight and parallel so that the aligned female connectors 22b and 26b are able to receive them in parallel as the circuit breaker is linearally inserted into the board connector receptacle.

It should be understood by those skilled in the art that the connector device provides a simple, highly reliable means of connecting circuit breakers easily to a printed circuit board with an arrangement whereby the circuit breakers can be kept generally parallel to the board so that it projects a minimum distance away from the circuit board and therefore allows the whole assembly to be more compact. Alternatively, the circuit breaker could be supported generally normal to the circuit board, if that is desired, by changing the general configuration of the connector device without changing the concept thereof. Various support geometries will be obvious to those skilled in the art. Other modifications involving more terminal connections and different kinds of internal and external latch means can be provided. Of course, the active latch means may be on the connector device engaging a passive latch means on the circuit breaker if desired.

Other changes and modifications will occur to those skilled in the art. All such changes are intended to be within the scope and spirit of the present invention as defined by the claims appended hereto.

I claim:

1. A circuit breaker and printed circuit board connector combination comprising
   a connector receptacle provided with enclosing walls having at least one flat side for application to a circuit board;
   at least a pair of conductive electrical connectors within and supported by the connector receptacle;
   pin connectors electrically connected to the respective connectors and mechanically supported by the connector receptacle projecting generally normal to and away from the at least one flat side of the connector receptacle so as to be insertable in receiving openings on the printed circuit board whereby the flat side may be kept parallel to the printed circuit board and the pin connectors for different connectors may be conductively connected to different conductors of the printed circuit board;
   a latch cooperative element on the connector receptacle including a shoulder;
   a circuit breaker having electrical connectors arranged to cooperate with the connectors on the connector receptacle by moving the circuit breaker and the connector device together in a generally linear direction transverse to the general plane of the shoulder of the latch cooperative element; and
   a latch element extending from the circuit breaker including a shoulder cooperative with the shoulder of the latch cooperative element on the connector device to engage and hold the circuit breaker in the position with the connectors of the breaker and connector receptacle interconnected, such that either the latch element or the latch cooperative element, or both, is deflected transversely of the direction of movement by the movement of the circuit breaker and connector device together and resiliently repositioned to accomplish latching.

2. The combination of claim 1 in which the connector receptacle is composed of molded resinous material and provides a cavity with guide surfaces into which a conforming extension of the circuit breaker extends and by which it is guided during connection.

3. The combination of claim 2 in which the circuit breaker extension, including the latch member, is provided a separate molded member supported between molded extensions of casing halves which embrace the extension and the extension is held in place by interlocking pieces on the extension and the casing.

4. The connector device of claim 2 in which each of the connectors on the connector receptacle is a female connector and the pin connectors and their support are formed of a single piece of metal.

5. The combination of claim 3 in which the single pieces are sheet metal and a portion of the sheet metal is bent to form embracing channels providing the female connectors and designed to receive parallel terminal connectors on the circuit breaker.

6. A printed circuit board providing electrical connection to and supporting a breaker connector device comprising:
   a connector receptacle provided with enclosing walls having at least one flat side for application to a circuit board;
   at least a pair of conductive electrical connectors within and supported by the connector receptacle;
   pin connectors electrically connected to the respective connectors and mechanically supported by the connector receptacle projecting generally normal to and away from the at least one flat side of the connector receptacle;
   a latch cooperative element on the receptacle;
   a printed circuit board having electrical conductors and receiving openings on the printed circuit board into which the pin connectors of the connector receptacle are inserted and soldered whereby the flat side may be kept parallel to the printed circuit board and the pin connectors may be conductively connected to different conductors of the printed circuit board;
   a circuit breaker having electrical connectors arranged to cooperate with the connectors on the connector receptacle by moving the circuit breaker in a generally linear direction toward the connector device; and
   A latch element extending from the circuit breaker cooperative with the latch element on the connector device to engage and hold the circuit breaker in position with the connector breaker and connector receptacle interconnected.

7. A circuit breaker and printed circuit board connector combination comprising
   a connector receptacle composed of resinous material provided with enclosing walls forming a cavity with guide surfaces including a cam surface molded into the cavity walls and having at least one flat side on an outside surface for application to a circuit board;
   at least a pair of conductive electrical connectors within and supported by the connector receptacle;

pin connectors electrically connected to the respective connectors and mechanically supported by the connector receptacle projecting generally normal to and away from the at least one flat side of the connector receptacle so as to be insertable in receiving openings on the printed circuit board whereby the flat side may be kept parallel to the printed circuit board and the pin connectors for different connectors may be conductively connected to different conductors of the printed circuit board;

a latch cooperative element on the connector receptacle;

a circuit breaker having electrical connectors arranged to cooperate with the connectors on the connector receptacle by moving the circuit breaker and the connector device together in a generally linear direction; and a latch element and support extending from the circuit breaker and conforming to the cavity of the connector receptacle and including a resilient cam lever latch element on the circuit breaker positioned to be deflected by the cam surface in the connector receptacle until it passes a shoulder on the receptacle defining the latch cooperative element adjacent the cam against which the latch will rest to engage and hold the circuit breaker in the position with the connectors of the breaker and the connector receptacle interconnected.

8. The combination of claim 7 in which the receptacle walls are open on each end and arranged so that the internal walls conform to at least the end of the extension to guide the conforming extension of the circuit breaker generally into position and one wall provides the cam surface which deflects the latch member and which terminates at the other end in the shoulder providing the latching surface, whereby the latch member moves into position against the shoulder and is exposed to be easily manually released.

9. The circuit breaker and printed circuit board connector combination of claim 7 in which the receptacle cavity extends through the connector receptacle and in addition to conforming to the cavity, the latch support and the cavity are tapered so that their interconnection is guided toward mating position and the latch element itself will extend beyond the cavity when it is latched in a position where it can readily be manually released.

10. The circuit breaker and printed circuit board connector combination of claim 9 in which the latch element is provided by a separate molded member between the support which is provided by a molded extension of casing halves enclosing the circuit breaker which casing halves embrace the extension and the extension is held in place by interlocking pieces on the extension and the casing.

* * * * *

UNITED STATES PATENT AND TRADEMARK OFFICE
CERTIFICATE OF CORRECTION

PATENT NO. : 4,886,462

DATED : December 12, 1989

INVENTOR(S) : Joseph Fierro

It is certified that error appears in the above-identified patent and that said Letters Patent is hereby corrected as shown below:

Column 3, line 32, "see" should read --seen--;
        line 51, "26g" should read --26c--.

Signed and Sealed this

Nineteenth Day of February, 1991

*Attest:*

HARRY F. MANBECK, JR.

*Attesting Officer*      *Commissioner of Patents and Trademarks*